(12) United States Patent
Kobayashi et al.

(10) Patent No.: US 7,961,065 B2
(45) Date of Patent: Jun. 14, 2011

(54) NOISE FILTER

(75) Inventors: Hidekazu Kobayashi, Tokyo (JP);
Yasuhiko Nishioka, Tokyo (JP); Minoru Sasaki, Tokyo (JP); Seigen Maeno, Okazaki (JP)

(73) Assignees: Harada Industry Co., Ltd., Tokyo (JP); Toyota Jidosha Kabushiki Kaisha, Aichi-Ken (JP)

( * ) Notice: Subject to any disclaimer, the term of this patent is extended or adjusted under 35 U.S.C. 154(b) by 223 days.

(21) Appl. No.: 11/990,560

(22) PCT Filed: Aug. 11, 2006

(86) PCT No.: PCT/JP2006/315964
§ 371 (c)(1),
(2), (4) Date: Apr. 10, 2008

(87) PCT Pub. No.: WO2007/020902
PCT Pub. Date: Feb. 22, 2007

(65) Prior Publication Data
US 2009/0115551 A1    May 7, 2009

(30) Foreign Application Priority Data
Aug. 15, 2005    (JP) .................................. 2005-235273

(51) Int. Cl.
*H03H 7/00* (2006.01)
(52) U.S. Cl. ......... 333/177; 333/172; 333/175; 333/185

(58) Field of Classification Search ................... 333/172, 333/175, 177, 185
See application file for complete search history.

(56) References Cited

U.S. PATENT DOCUMENTS

| | | | |
|---|---|---|---|
| 3,601,734 A * | 8/1971 | Chesney | 336/83 |
| 6,157,283 A * | 12/2000 | Tsunemi | 336/192 |
| 6,535,095 B2 * | 3/2003 | Aoki et al. | 336/83 |
| 6,680,664 B2 * | 1/2004 | Fan | 336/83 |
| 2008/0084254 A1 * | 4/2008 | Takahashi et al. | 333/184 |

FOREIGN PATENT DOCUMENTS

| | | |
|---|---|---|
| JP | 57-190306 | 11/1982 |
| JP | 07-272942 | 10/1995 |
| JP | 09-213528 | 8/1997 |

OTHER PUBLICATIONS

International Search Report completed Sep. 22, 2006.

* cited by examiner

*Primary Examiner* — Robert Pascal
*Assistant Examiner* — Kimberly E Glenn
(74) *Attorney, Agent, or Firm* — Wells St. John, P.S.

(57) ABSTRACT

The invention can provide a miniaturized noise filter. The noise filter for reducing noise comprises a coil with a conductive wire (2) wound around a core (1); a case (6) formed of an insulating material receiving the coil; a bracket (8) of a magnetic material forming a flux path of magnetic flux generated from the coil, which places the case thereon, which has a pair of end plates (12*a*, 12*b*) disposed opposite to both ends of the core of the coil respectively through a gap of a predetermined distance, and which has a bottom plate (8*a*) disposed between the pair of the end plates; and an input/output terminal (3*a*, 3*b*) for the coil.

8 Claims, 5 Drawing Sheets

(a)

(b)

NOISE FILTER

CROSS REFERENCE TO RELATED APPLICATION

This is a 35 U.S.C. §371 application of and claims priority to PCT International Application No. PCT/JP2006/315964, which was filed Aug. 11, 2006, and which claims priority to Japanese Patent Application No. 2005-235273, which was filed on Aug. 15, 2005, and the teachings are incorporated herein by reference.

TECHNICAL FIELD

The present invention relates to a noise filter, and more particularly to a noise filter which reduces noises generated from in-vehicle electric components, and which improves an S/N ratio (Signal-to-Noise ratio) of an in-vehicle radio receiver, etc.

BACKGROUND ART

A noise filter (a choke coil) is used for a glass antenna of a vehicle radio receiver to reduce noises and improve an S/N ratio of the radio receiver. It is well-known that such a noise filter is constituted by disposing on a resin fixing-base a coil formed by cylindrically winding a conductive wire around a columnar core, and by connecting both ends of the coil to two metal plates provided on the fixing-base respectively (see Patent Literature 1).

Patent Literature 1: Japanese Patent Application Kokai Publication No. Hei 9-213528

DISCLOSURE OF INVENTION

Problems to be Solved by the Invention

However, in case of the conventional noise filter for the glass antenna which uses, for example, with a switch for driving a large current under the condition of which large noises are generated with increasing current, the number of turns of the coil must be increased. Therefore, there is a problem in which the noise filter itself should become large in size.

There is also a problem in which heat discharge may increase with increasing the number of turns of the coil. Further, in the case where a magnetic material such as an iron plate exists at the installation location of the noise filter, there is a problem in which characteristics of the noise filter may be changed under the influence of the magnetic material existing at the installation location because magnetic flux spreads at the center of the coil.

An object of the present invention, therefore, is to overcome the problems existing in the prior art, and to provide a noise filter which can be miniaturized than ever before. Also, an object of the present invention is to provide a noise filter which can suppress the heat discharge, and which can suppress the change of the filter characteristics even if the magnetic material exists at the installation location.

Means for Resolving the Problems

According to one aspect of the invention, there is provided a noise filter comprising: a coil with a conductive wire wound around a core; a case formed of an insulating material receiving the coil; a bracket of a magnetic material forming a flux path of magnetic flux generated from the coil, which places the case thereon, which has a pair of end plates disposed opposite to both ends of the core of the coil respectively through a gap of a predetermined distance, and which has a bottom plate disposed between the pair of the end plates; and an input/output terminal for the coil.

Each of the end plates may have an area of a surface opposite to the core larger than a cross sectional area of the core.

Also, the gap may be formed by providing a part of the case to between the core and the each end plate.

Furthermore, the input/output terminal may be formed by using a combination of an L-type terminal and/or an I-type terminal.

The noise filter may further comprise a capacitor forming a filter by combining with the coil, the bracket having electrical conductivity and being connected to a ground, and one of terminals of the capacitor being connected to the bracket.

Effects of the Invention

According to the present invention, a noise filter can be miniaturized than the conventional one. The noise filter of the present invention also can suppress the heat discharge, and suppress the change of the filter characteristics even if the magnetic material exists at the installation location. Further, the filter installability to the vehicle can be enhanced because the flexibility of wiring is improved.

BEST MODE FOR CARRYING OUT THE INVENTION

Now, a noise filter of an embodiment according to the present invention is explained with reference to the drawings. In FIGS. 1-6, the same structural elements are depicted by the same reference numerals.

FIG. 1 is a perspective view showing a condition where a cover of the noise filter of the embodiment according to the invention is detached. FIG. 2 is a top view showing a condition where a cover of the noise filter is detached. FIG. 3 is a perspective view showing a condition where a cover of the noise filter is attached. FIG. 4 is a cross sectional view of the noise filter viewed from the A-direction in FIG. 3. FIG. 5 is an exploded view of each component part of the noise filter.

As shown in the figures, a coil is formed by winding a conductive wire 2 around a columnar core 1 of a magnetic material such as a ferrite. Both ends of the conductive wire of the coil are connected to input/output terminals 3a and 3b respectively, and wirings 4a and 4b are connected to the noise filter therethrough. In addition, in the preferred embodiment of the invention, the form of the core is columnar, but it should be understood that it is not limited to such form.

A π-type filter using capacitors 5a and 5b is shown in the illustrated example. One end terminal of each of the capacitors 5a and 5b is electrically connected to each end of the conductive wire 2, respectively, and another end terminal is electrically connected to each of earth plates 11a and 11b of a conductive bracket 8 of a magnetic material, respectively. In the preferred embodiment of the invention, the bracket 8 forms a bottom of a housing of the noise filter, and also has a role of an electrical earth plate when the noise filter is attached to a body of a vehicle. In addition, the two capacitors 5a and 5b are used in the preferred embodiment, but it should be understood that the filter may be constituted by an LC filter using one capacitor and one coil. The filter may also be constituted by a T-type filter using two coils and one capacitor. Further, the filter may be constituted by only a coil as a choke coil without a capacitor. Also, the filter may be not only a normal mode but also a common mode. As described above, the filter of the present invention may be constituted by any filter circuits as long as the noise filter can be constituted by using a coil.

The coil constituted by the core 1 and the conductive wire 2 is placed in a case 6 formed of an insulating material such as a resin. A clip 7 is formed of an insulating material similar to the case 6, and is used in which the clip is inserted in a hole 8*b* formed on the bracket 8 so as to temporarily fix the filter to an installation location. Also, a clip portion 7*a* is formed on one surface of the clip 7 so as to lock the noise filter by hitching to the installation location. In addition, if the noise filter is temporarily fixed to the installation location by a double-faced adhesive tape, etc., the above clip may be omitted.

The case 6 which receives the coil constituted by the core 1 and the conductive wire 2 is placed on the bracket 8. The bracket 8 has a pair of end plates 12*a* and 12*b*, and a main body 8*a* of the bracket 8. The end plates 12*a* and 12*b* are faced with each other, and each is disposed opposite to both ends of the core 1 of the coil through a gap Δ of a predetermined distance, respectively. The main body 8*a* is a bottom plate and disposed between the end plates. More specifically, the bracket 8 has the end plates 12*a* and 12*b* which are bent almost perpendicularly to the main body 8*a* of the bracket 8, and which are disposed opposite to both ends of the core 1, respectively, with a gap Δ of a predetermined distance each through a hole formed on the case 6 when the case is placed thereon. That is, the gap Δ is provided by the intervention of a part of the case 6 between the core 1 and each of the end plates 12*a* and 12*b*. Also, in the illustrated example using two capacitors 5*a* and 5*b*, the bracket 8 is formed of a magnetic material and has electrical conductivity. The bracket 8 also has earth plates 11*a* and 11*b* to which another end terminal of each of the capacitors 5*a* and 5*b* is connected for grounding. An area of a surface of each of the end plates 12*a* and 12*b* opposite to the core is larger than a cross sectional area of the core 1. Also, the surface area may be size enough to allow magnetic flux generated by the coil.

FIG. 6 is a view for explaining the gap between the coil and each of the end plates 12*a* and 12*b* of the bracket 8.

The bracket 8 forms a bottom surface of the noise filter according to one embodiment of the present invention, and the case 6 forms a side surface thereof. The bracket 8 and the coil are electrically insulated because the case 6 of the insulating material intervenes therebetween.

The end plates 12*a* and 12*b* are disposed to be faced with each other with a gap Δ of a predetermined distance to the core 1, so that a magnetically closed-loop magnetic flux is formed by the end plates 12*a* and 12*b* and the bottom plate 8*a*. The magnetic flux, therefore, concentrates on the bracket 8 side without spreading, and the magnetical influence to be provided to peripheral circuits of the noise filter can be reduced.

The above gap Δ of a predetermined distance is secured by the wall thickness of a part of the case 6 intervening therein, and selected so as to prevent the magnetic saturation. That is, the gap Δ is to be magnetic resistance of the magnetic circuit including coil and bracket 8, and the magnetic resistance is selected to prevent the magnetic saturation in the magnetic circuit of the noise filter. In addition, the case 6 is formed of an insulating material, and magnetically equal to a gap constituted by air.

In the preferred embodiment of the invention, two gaps Δ between each of the end plates 12*a* and 12*b* and the core 1 are the same distance, but they can be different from each other as long as the magnetic saturation in the magnetic circuit of the noise filter is prevented.

If necessary, a cover 9 is attached on the case 6, which has slits 9*a* for discharging heat from the coil and which is formed of an insulating material such as a resin.

In addition, the noise filter using the capacitors is shown in the illustrated example, but in case of a filter without a capacitor, the bracket need not have electrical conductivity as long as the bracket is formed of a magnetic material.

The noise filter according to the present invention can be miniaturized than the conventional one, and is less subject to the magnetical influence, so that the flexibility of installation to a vehicle is enhanced. Therefore, it can be attached on almost every location. In this case, however, there may be a problem of how to draw out the wiring for the noise filter. In the present invention, the flexibility of the wiring drawing-out direction is improved by constituting the input/output terminal using a combination of an L-type terminal and/or an I-type terminal as explained below.

Now, the input/output terminal of the noise filter according to the present invention is described in more detail. FIG. 7 is a perspective view for explaining relation between the input/output terminals of the noise filter, the conductive wire of the coil and the wirings, FIG. 7(*a*) being a diagram for explaining the I-type terminal and FIG. 7(*b*) being a diagram for explaining the L-type terminal. The I-type terminal 3*a* can connect the wiring 4*a* almost perpendicularly to a direction of the conductive wire 2. The L-type terminal 3*b* can connect the wiring 4*b* in almost the same direction side by side to a direction of the conductive wire 2. The L-type terminal 3*b* also can connect the wiring 4*b* in either two directions side by side. Each of the input/output terminals 3*a* and 3*b* has a predetermined crimp portion for crimping the wirings 4*a* and 4*b*, respectively. Each of the input/output terminals 3*a* and 3*b* also has a connecting portion for soldering the conductive wire 2 of the coil. As to the I-type terminal 3*a*, an opening direction of the crimp portion for the wiring is almost perpendicular to an opening direction of the connecting portion for the conductive wire. As to the L-type terminal 3*b*, an opening direction of the crimp portion for the wiring is almost the same direction with an opening direction of the connecting portion for the conductive wire. In addition, in the example of the noise filter using a combination of a capacitor and a coil, a connecting portion to be connected to one of the capacitor terminals may be provided to the input/output terminal.

Many drawing-out direction patterns of the wirings by combining the input/output terminals constituted as above are shown in FIG. 8. FIG. 8 is a top view for explaining drawing-out direction patterns of the wirings for the noise filter according to the present invention. As illustrated in the figure, the wirings can be drawn out in three directions for input and three directions for output. More specifically, FIGS. 8(*a*), 8(*c*), 8(*g*) and 8(*i*) show examples each using two L-type terminals, FIGS. 8(*b*), 8(*d*), 8(*f*) and 8(*h*) show examples each using a combination of the L-type terminal and the I-type terminal, and FIG. 8(*e*) shows an example using two I-type terminals, respectively. As explained above, since the noise filter according to the present invention can accomplish nine patterns of the drawing-out of the wirings, the flexibility of wiring is enhanced for the noise filter and the noise filter installability to the vehicle can be improved.

As has been described in the foregoing, the embodiment of the noise filter according to the invention, the magnetic flux generated from the coil is made to the closed-loop with the gap Δ by using the bracket 8, so that the magnetic flux concentrates on the bracket 8 side and the magnetical influence to be provided to other devices can be reduced. Further, that makes the noise filter itself less likely to be affected by the magnetical influence from outside. That also produces an effect that the installability of the noise filter for the installation location is enhanced.

Moreover, since higher inductance can be accomplished by making the closed-loop magnetic flux than under the condition of the opened-loop, the number of turns of the coil can be reduced, thereby miniaturizing a noise filter. Further, because the number of turns of the coil according to the invention needs less than that in the prior art having the same characteristics, heat generation can be kept low. Additionally, the grounding of the capacitor can be conducted by the bracket, thereby miniaturizing the noise filter.

Furthermore, the noise filter installability to the vehicle can be improved because the L-type terminal and the I-type terminal are used in combination to obtain many patterns of the drawing-out of the wirings.

While the invention has been described in its preferred embodiments, it is to be understood that the words which have been used are words of description rather than limitation and that changes within the purview of the appended claims may be made without departing from the true scope of the invention as defined by the claims. Also, various inventions can be formed by combining a plurality of components disclosed in the above embodiment appropriately. For example, some components can be omitted from all components of the embodiment described above. Further, components covering different embodiments can be combined.

Figure 1:
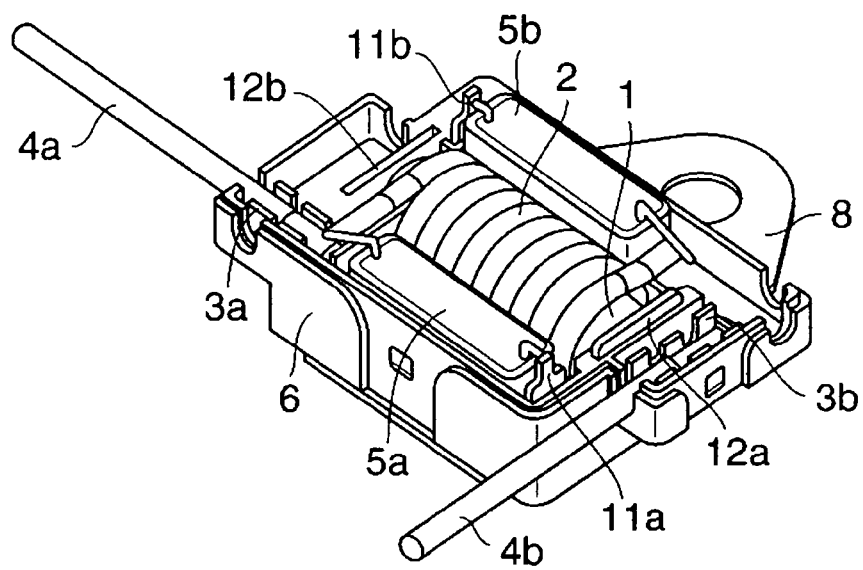
FIG. 1 is a perspective view showing a condition where a cover of the noise filter of the embodiment according to the invention is detached.
Figure 2:
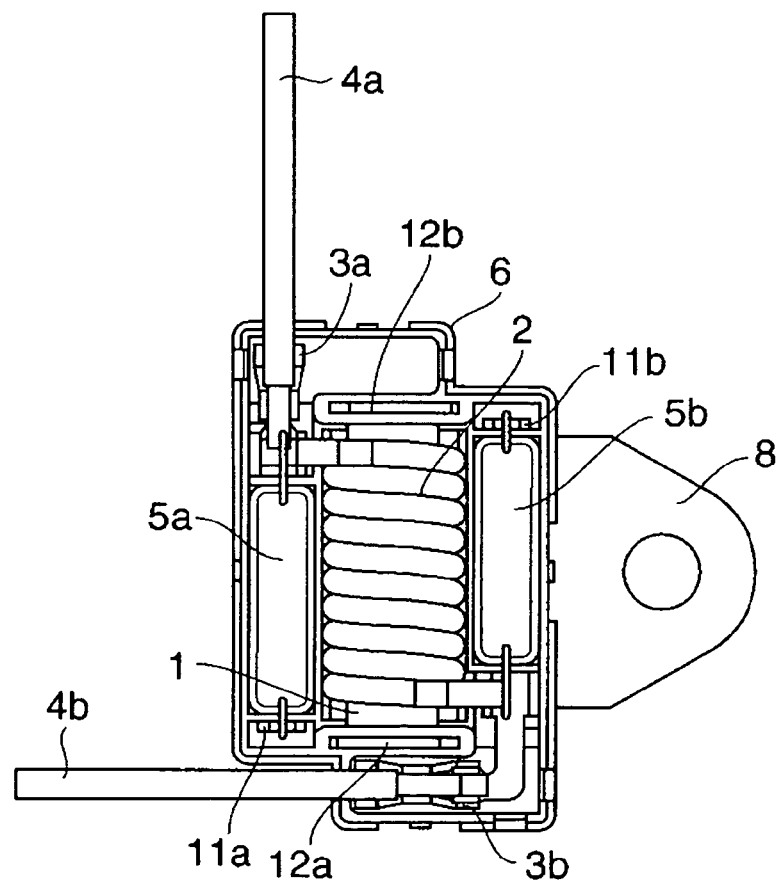
FIG. 2 is a top view showing a condition where a cover of the noise filter is detached.
Figure 3:
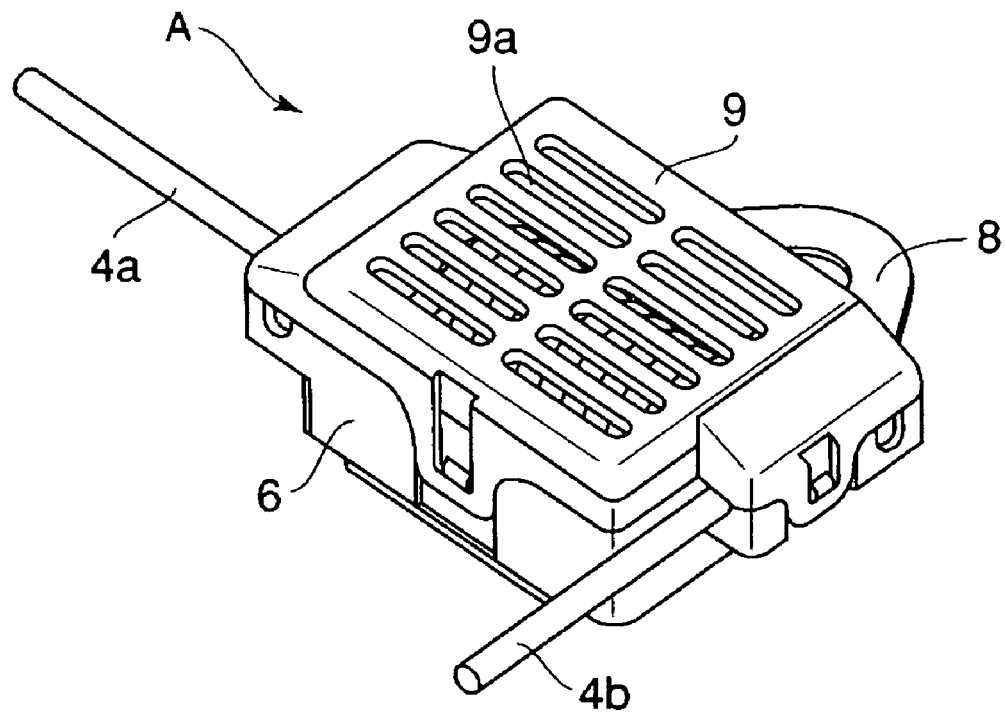
FIG. 3 is a perspective view showing a condition where a cover of the noise filter is attached.
Figure 4:
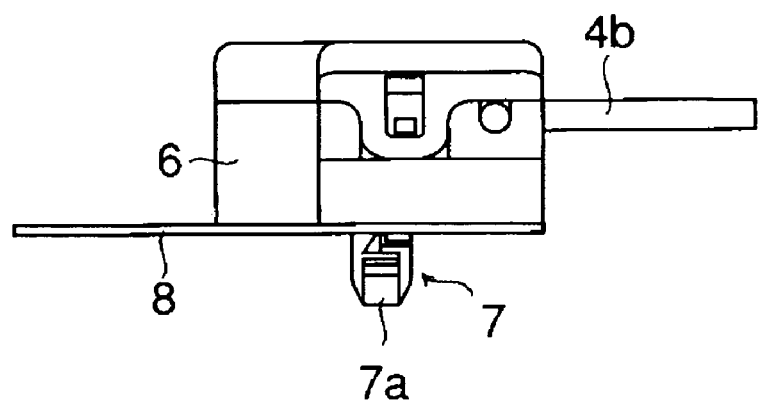
FIG. 4 is a cross sectional view of the noise filter viewed from the A-direction in FIG. 3.
Figure 5:
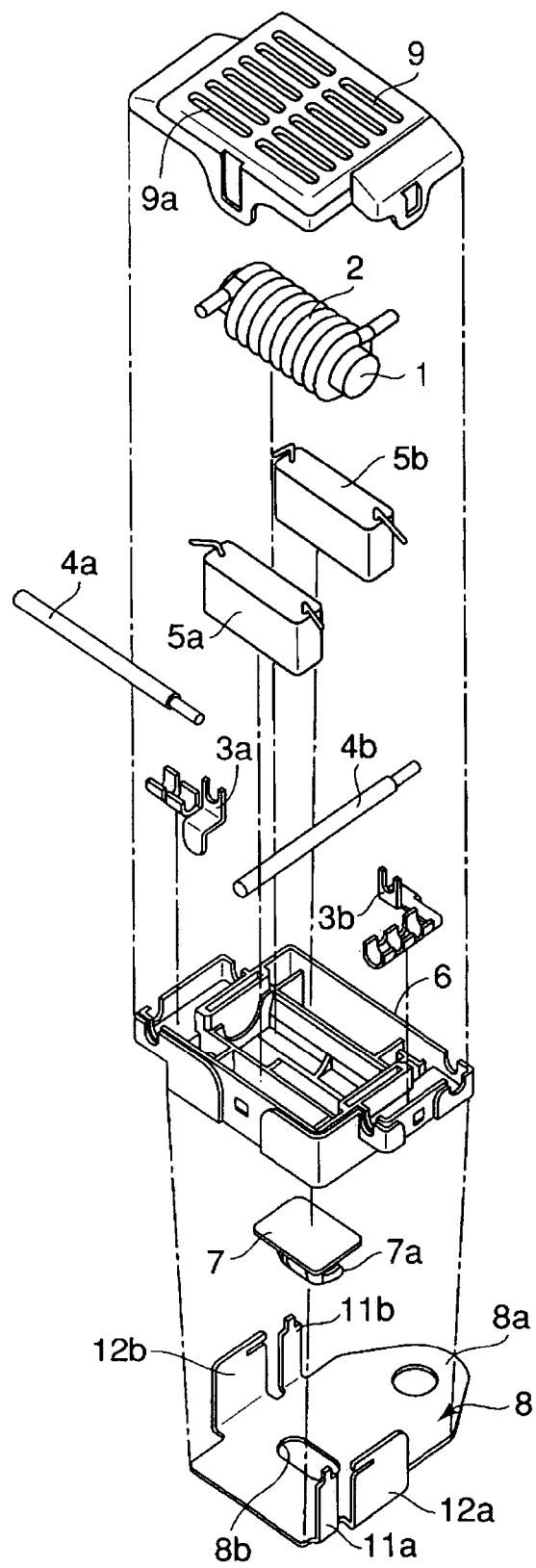
FIG. 5 is an exploded view of each component part of the noise filter.
Figure 6:
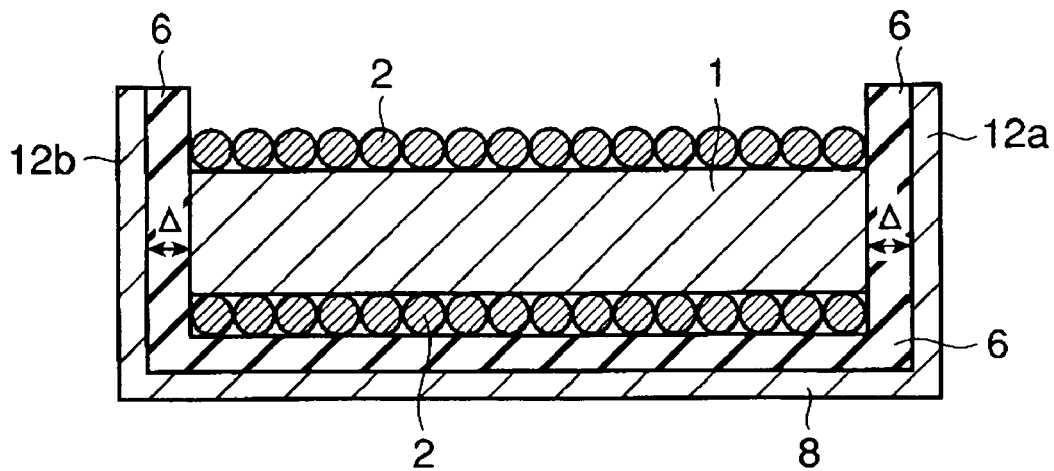
FIG. 6 is a view for explaining the gap between the coil and each of end plates of the bracket.
Figure 7:
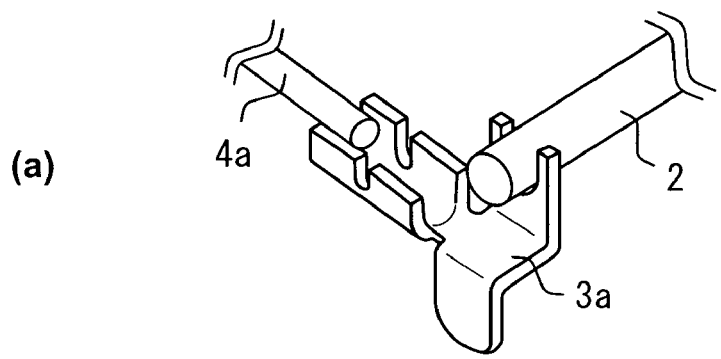
FIG. 7 is a perspective view for explaining the L-type terminal and the I-type terminal.
Figure 7:
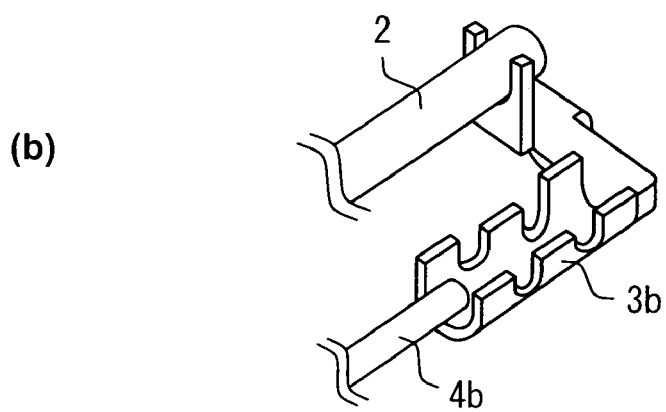
Figure 8:
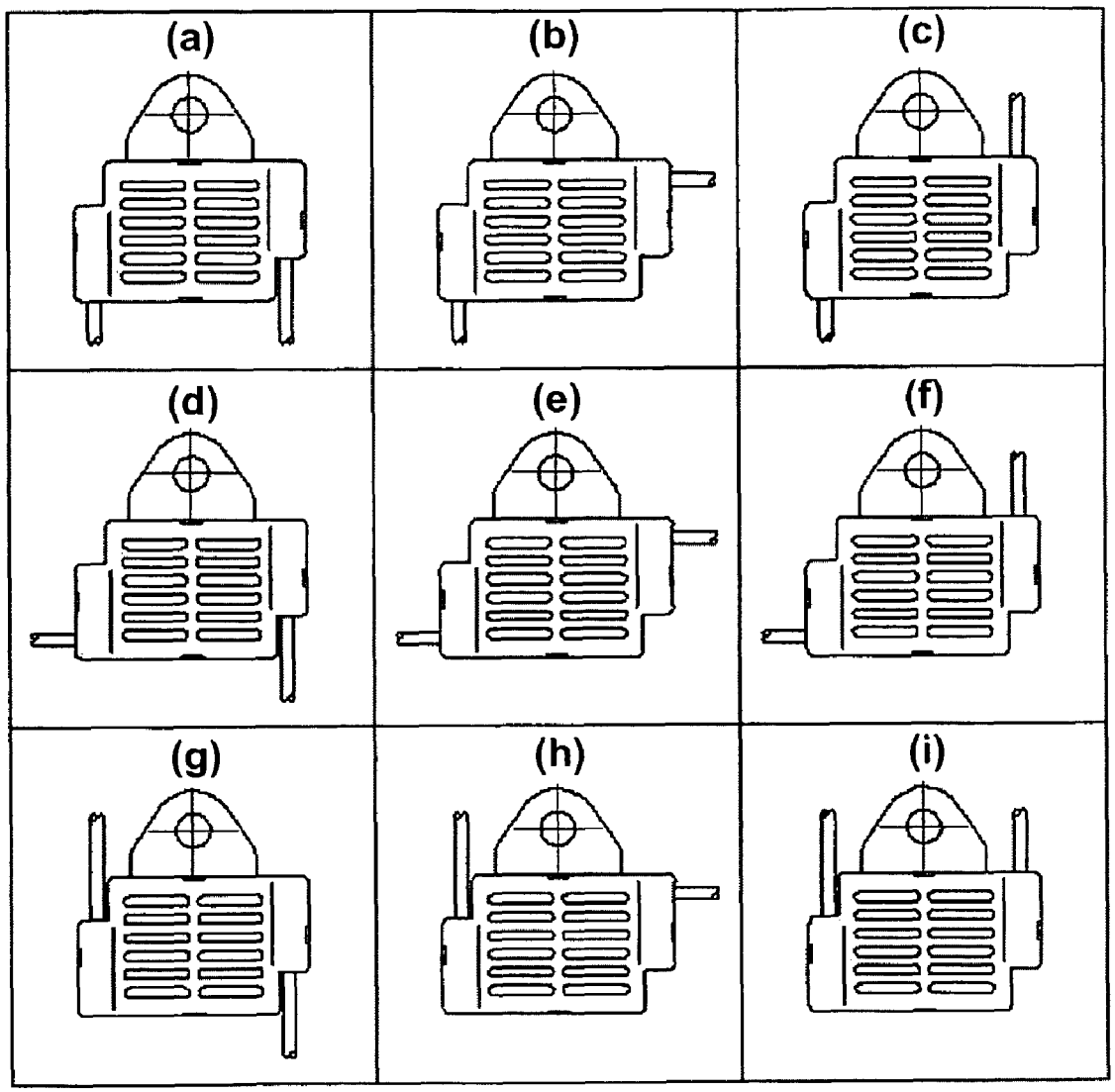
FIG. 8 is a top view for explaining drawing-out direction patterns of the wirings.

EXPLANATION OF REFERENCE NUMERALS 1. a core, 2. a conductive wire, 3a and 3b. input/output terminals, 4a and 4b. wirings, 5a and 5b. capacitors, 6. a case, 7. a clip, 7a. a clip portion, 8. a bracket, 9. a cover, 9a. slits, 11a and 11b. earth plates, 12a and 12b. end plates.

What is claimed is:

1. A noise filter comprising:
a coil with a conductive wire wound around a core;
a case formed of an insulating material receiving the coil;
a bracket of a magnetic material forming a flux path of magnetic flux generated from the coil, which places the case thereon, which has a pair of end plates disposed opposite to both ends of the core of the coil respectively through a gap of predetermined distance, and which has a bottom plate disposed between the pair of the end plates;
an input/output terminal for the coil; and
in which the input/output terminal is formed by using one of the following terminal combinations: a first terminal combination comprising an L-shaped terminal and a I-shaped terminal or a second terminal combination comprising two L shaped terminals.

2. The noise filter according to claim 1, in which each of the end plates has an area of a surface opposite to the core larger than a cross sectional area of the core.

3. The noise filter according to claim 1, in which the gap is formed by providing a part of the case to between the core and the each end plate.

4. The noise filter according to claim 1, further comprising a capacitor forming a filter by combining with the coil,
the bracket having electrical conductivity and being connected to a ground, and one of terminals of the capacitor being connected to the bracket.

5. A noise filter comprising:
a coil with a conductive wire wound around a core;
a case formed of an insulating material receiving the coil;
a bracket of a magnetic material forming a flux path of magnetic flux generated from the coil, which places the case thereon, which has a pair of end plates disposed opposite to both ends of the core of the coil respectively through a gap of predetermined distance, and which has a bottom plate disposed between the pair of the end plates;
an input/output terminal for the coil;
a capacitor forming a filter by combining with the coil; and
the bracket having electrical conductivity and being connected to a ground, and one of terminals of the capacitor being connected to the bracket.

6. The noise filter according to claim 5, in which each of the end plates has an area of a surface opposite to the core larger than a cross sectional area of the core.

7. The noise filter according to claim 5, in which the gap is formed by providing a part of the case to between the core and the each end plate.

8. A noise filter comprising:
a coil with a conductive wire wound around a core;
a case formed of an insulating material receiving the coil;
a bracket of a magnetic material forming a flux path of magnetic flux generated from the coil, which places the case thereon, which has a pair of end plates disposed opposite to both ends of the core of the coil respectively through a gap of predetermined distance, and which has a bottom plate disposed between the pair of the end plates;
an input/output terminal for the coil;
in which the input/output terminal is formed by using a combination of an L shaped terminal and/or an I shaped terminal;
a capacitor forming a filter by combining with the coil; and
the bracket having electrical conductivity and being connected to a ground, and one of terminals of the capacitor being connected to the bracket.

* * * * *

UNITED STATES PATENT AND TRADEMARK OFFICE
CERTIFICATE OF CORRECTION

PATENT NO. : 7,961,065 B2
APPLICATION NO. : 11/990560
DATED : June 14, 2011
INVENTOR(S) : Hidekazu Kobayashi et al.

It is certified that error appears in the above-identified patent and that said Letters Patent is hereby corrected as shown below:

Column 1, line 55 – Replace "miniaturized than" with --miniaturized more than--

Column 2, line 10 – Replace "core and the each" with --core and each--

Column 2, line 22 – Replace "miniaturized than" with --miniaturized more than--

Column 4, line 9 – Replace "miniaturized than" with --miniaturized more than--

Column 5, line 43 – Replace "each of end" with --each of the end--

Column 6, line 15 – Replace "the each end" with --each end--

Column 6, line 41 – Replace "the each end" with --each end--

Signed and Sealed this
Twelfth Day of February, 2013

Teresa Stanek Rea
*Acting Director of the United States Patent and Trademark Office*